US009252462B2

(12) United States Patent
Kim

(10) Patent No.: US 9,252,462 B2
(45) Date of Patent: Feb. 2, 2016

(54) BATTERY MANAGEMENT SYSTEM

(75) Inventor: Meensuk Kim, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 818 days.

(21) Appl. No.: 13/455,029

(22) Filed: Apr. 24, 2012

(65) Prior Publication Data

US 2012/0293133 A1 Nov. 22, 2012

Related U.S. Application Data

(60) Provisional application No. 61/487,675, filed on May 18, 2011.

(51) Int. Cl.
| | | |
|---|---|---|
| *H02J 7/00* | (2006.01) | |
| *H01M 10/42* | (2006.01) | |
| *H01M 10/48* | (2006.01) | |
| *B60L 7/16* | (2006.01) | |
| *G01R 31/36* | (2006.01) | |
| *H01M 10/46* | (2006.01) | |

(52) U.S. Cl.
CPC ............. *H01M 10/425* (2013.01); *B60L 7/16* (2013.01); *G01R 31/362* (2013.01); *H01M 10/48* (2013.01); *B60L 2270/147* (2013.01); *H01M 10/46* (2013.01); *H01M 10/482* (2013.01); *H01M 2010/4271* (2013.01); *H01M 2220/20* (2013.01)

(58) Field of Classification Search
None
See application file for complete search history.

(56) References Cited

U.S. PATENT DOCUMENTS

| | | | | |
|---|---|---|---|---|
| 5,737,168 | A * | 4/1998 | Baker | 361/90 |
| 5,801,519 | A * | 9/1998 | Midya et al. | 323/222 |
| 7,023,683 | B1 * | 4/2006 | Guo et al. | 361/166 |
| 8,896,315 | B1 * | 11/2014 | Davies | 324/434 |
| 8,946,937 | B2 * | 2/2015 | Stratakos et al. | 307/104 |
| 2008/0088279 | A1 | 4/2008 | Lim et al. | |
| 2008/0100268 | A1 | 5/2008 | Lim et al. | |
| 2009/0256534 | A1 * | 10/2009 | Videtich et al. | 323/235 |
| 2012/0200252 | A1 | 8/2012 | Kang et al. | |

FOREIGN PATENT DOCUMENTS

| | | |
|---|---|---|
| KR | 10-2003-0021004 A | 3/2003 |
| KR | 10-2008-0034352 A | 4/2008 |
| KR | 10-2008-0039653 A | 5/2008 |
| KR | 10-2009-0015334 A | 2/2009 |
| KR | 10-2010-0129005 A | 12/2010 |

* cited by examiner

*Primary Examiner* — A. M. Thompson
(74) *Attorney, Agent, or Firm* — Knobbe, Martens, Olson & Bear, LLP

(57) ABSTRACT

A battery management system (BMS) is disclosed. In one embodiment, the BMS includes i) a first switching circuit electrically connected to a battery cell or a battery pack and configured to provide a voltage of the battery cell or the battery pack, ii) a capacitor electrically connected to the first switching circuit and configured to store the voltage provided from the first switching circuit and iii) a second switching circuit electrically connected to the capacitor and configured to provide the voltage stored in the capacitor, wherein the second switching circuit has first and second output terminals. The BMS may further include a pull-down circuit electrically connected to the second switching circuit, and configured to reduce impedance at the first output terminal of the second switching circuit.

17 Claims, 3 Drawing Sheets

BATTERY MANAGEMENT SYSTEM

RELATED APPLICATION

This application claims priority to and the benefit of Provisional Patent Application No. 61/487,675 filed on May 18, 2011 in the U.S Patent and Trademark Office, the entire contents of which are incorporated herein by reference.

BACKGROUND

1. Field

The described technology generally relates to a battery management system.

2. Description of the Related Technology

In general, vehicles using gasoline, diesel oil or LPG as fuel generate a large quantity of carbon dioxide emissions which pollute the atmosphere and induce global warming, thereby damaging the global environment. Accordingly, research has been actively conducted on hybrid electric vehicles (HEV) having low emissions or electric vehicles (EV) having zero emissions.

An HEV is powered by an electric motor, which uses electricity supplied from a main battery via a power conversion circuit as a driving source, as well as an internal combustion engine. Further, an HEV may be operated so as to improve the fuel efficiency of the vehicle to a high degree according to a driving situation.

The HEV motor is switched between a driving mode and a generation mode through the control of a motor control unit (MTCU) when the vehicle is braked or decelerated. At this time, the main battery is charged by the electric energy generated from a generator (or driving motor) under the control of a battery management system (BMS) connected to the MTCU. The current applied to the main battery from the generator may vary and even be discontinuous according to driving conditions.

To reach an appropriate degree of performances, the number of battery cells gradually increases, and the BMS must be capable of effectively managing the various battery cells.

SUMMARY

One inventive aspect is a battery management system (BMS), which can measure a battery voltage in a more accurate and stable manner.

Another aspect is a battery management system (BMS) including a first relay, a capacitor, a second relay, a pull-down circuit block, and a microcomputer unit. The first relay is connected to a battery cell or opposite ends of a battery pack and relays a voltage of the battery cell or the battery pack. The capacitor is connected to the first relay and stores the voltage relayed by the first relay. The second relay is connected to the capacitor and relays the voltage stored in the capacitor. The pull-down circuit block includes a resistor connected between output ports of the second relay and a switch. The microcomputer unit controls on/off of the first relay, the second relay and the pull-down circuit block, and the voltage stored in the capacitor is input to the microcomputer unit.

Another aspect is a battery management system (BMS), comprising: a first switching circuit electrically connected to a battery cell or a battery pack and configured to provide a voltage of the battery cell or the battery pack; a capacitor electrically connected to the first switching circuit and configured to store the voltage provided from the first switching circuit; a second switching circuit electrically connected to the capacitor and configured to provide the voltage stored in the capacitor, wherein the second switching circuit has first and second output terminals; and a pull-down circuit electrically connected to the second switching circuit, and configured to reduce impedance at the first output terminal of the second switching circuit.

The above system further comprises a controller configured to control on and off operations of the first and second switching circuits, and configured to receive the voltage that has been stored in the capacitor. In the above system, the pull-down circuit comprises a pull-down resistor, and wherein a first end of the pull-down resister is electrically connected to the first output terminal of the second switching circuit. In the above system, the pull-down resistor has a resistance value in the range from about 0.5 MOhm to about 1.5 MOhm. In the above system, the pull-down resistor has a resistance value of about 1 MOhm.

In the above system, the pull-down circuit further comprises a switch electrically connected to a second end of the pull-down resistor. In the above system, the switch comprises a transistor. In the above system, the transistor has i) a first electrode electrically connected to the second end of the pull-down resistor, ii) a second electrode electrically connected to the second output terminal of the second relay and iii) a control electrode electrically connected to the controller.

In the above system, the controller is configured to provide i) a first control signal to the first switching circuit and ii) a second control signal to the second switching circuit and the control electrode of the transistor. In the above system, the second control signal is configured to substantially periodically turn on and turn off the transistor. In the above system, the controller is configured to change the value of the second control signal without substantially affecting the voltage at the first output terminal of the second switching circuit. In the above system, the second control signal comprises a plurality of square waves that are substantially periodically repeated. In the above system, each of the switching circuits comprises a relay. The above system further comprises an output buffer. In the above system, the output buffer comprises an operational amplifier.

Another aspect is a battery management system (BMS), comprising: a first relay electrically connected to a battery and configured to relay a voltage of the battery; a capacitor electrically connected to the first relay and configured to store the voltage relayed from the first relay; a second relay electrically connected to the capacitor and configured to relay the voltage stored in the capacitor; and a resistor having first and second ends, wherein the first end is electrically connected to an output terminal of the second relay.

The above system further comprises a switching transistor electrically connected to the resistor and configured to be alternately turned on and turned off based on a control signal applied thereto. In the above system, the control signal is a square wave signal comprising a plurality of square waves that are substantially periodically repeated.

Another system is a battery system, comprising: a battery; a capacitor receiving a voltage from the battery; a voltage relay circuit electrically connected to the capacitor and configured to relay the voltage stored in the capacitor, wherein the voltage relay circuit comprises an output terminal; a resistor having first and second ends, wherein the first end is electrically connected to the output terminal of the voltage relay circuit; a switch electrically connected to the second end of the resistor; and a controller configured to control the switch.

In the above system, the switch is configured to substantially prevent a voltage drop at the output terminal of the voltage relay circuit based on a control signal received from the controller.

DETAILED DESCRIPTION

Embodiments will be described in detail with reference to the accompanying drawings.

Figure 1:
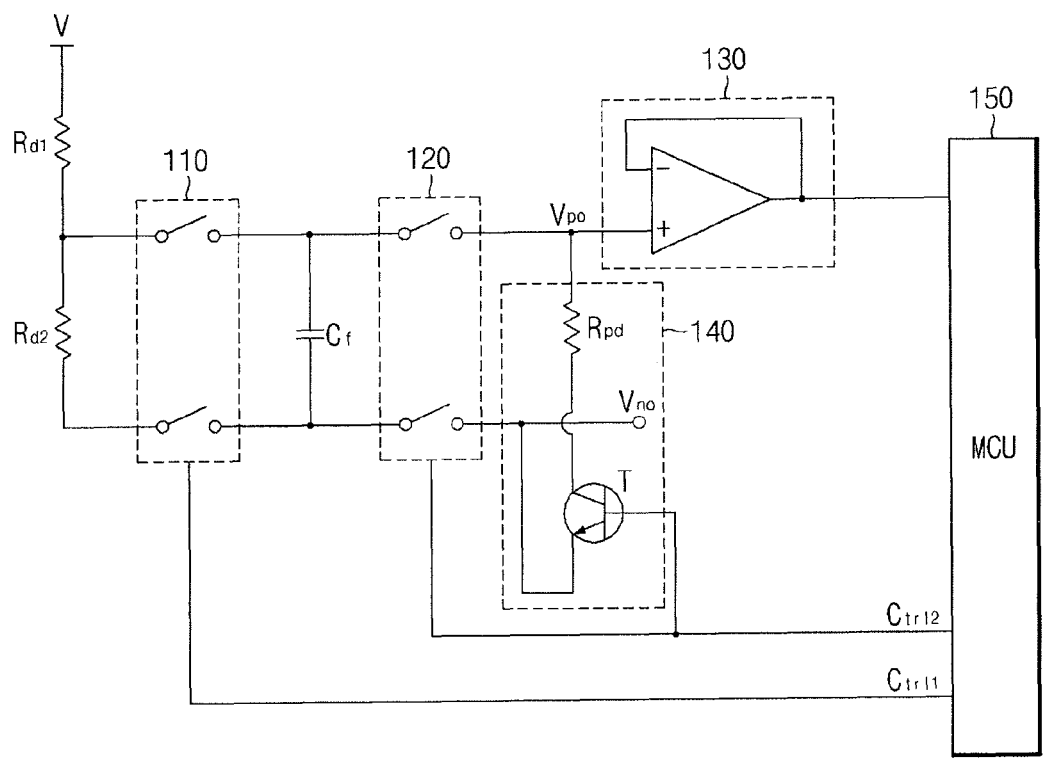
FIG. 1 is a diagram illustrating a configuration of a battery management system (BMS) according to an embodiment.

FIG. 1 is a diagram illustrating a configuration of a battery management system (BMS) according to an embodiment.

The BMS 100 shown in FIG. 1 measures and monitors the overall voltage V of a battery pack to protect the system.

Referring to FIG. 1, the BMS 100 includes a first relay 110, a capacitor $C_f$, a second relay 120, an output buffer 130, a pull-down circuit block 140 and a microcomputer unit (MCU) 150. The BMS 100 may further include a first distribution resistor $R_{d1}$ and a second distribution resistor $R_{d2}$ connected in series to each other. The first and second distribution resistors $R_{d1}$ and $R_{d2}$ divide the overall voltage V and convert the same into signal levels to be transmitted to the MCU 150. In another embodiment, first and second switching circuits can be used instead of the first and second relays 110 and 120. For the purpose of convenience of description, the first and second relays 110 and 120 will be used to explain the disclosed embodiments.

Although not shown, the BMS 100 may further include an ND converter that converts an analog signal to a digital signal and provides the converted digital signal to the MCU 150.

The first relay 110 may be electrically connected to opposite ends of a battery cell or a battery pack. The battery pack may include a plurality of battery cells (not shown) connected in series to each other. Therefore, the first relay 110 may include a main relay (not shown) and a plurality of sub relays (not shown). The sub relays may be electrically connected to opposite ends of the battery cells. The main relay may be electrically connected to the sub relays.

The first relay 110 receives a first control signal $C_{trl1}$ from the MCU 150 and performs a switching operation. If the first relay 110 receives a first control signal $C_{trl1}$ from the MCU 150, it becomes an active high state to then be turned on. Here, voltages of the battery cells are relayed to the main relay via the sub relays and then relayed to the capacitor $C_f$ via the main relay.

The first relay 110 may include an electromechanical relay or a semiconductor solid state relay (SSR) (e.g., a photo-MOS relay), but not limited thereto.

The electromechanical relay may include an inductor and an electromechanical switch. The electromechanical relay may be driven such that the electromechanical switch is magnetized by a current flowing in the inductor to perform a mechanical switching operation.

The photo-MOS relay may be an electronic switch that performs a switching operation in response to light.

The photo-MOS relay may include a light emitting diode (LED), a photo-sensor diode, and a metal oxide semiconductor field effect transistor (MOSFET). When a voltage is applied to the LED, light is generated, and the generated light is transferred to the photo-sensor diode. The photo-sensor diode exposed to the light turns on the photo-MOS relay as the voltage is applied between a source and a gate of the MOSFET.

The capacitor $C_f$ may be a flying capacitor. The opposite ends of the capacitor $C_f$ may be electrically connected to the first relay 110. For example, the opposite ends of the capacitor $C_f$ may be electrically connected to the main relay of the first relay 110. When the first relay 110 is turned on, the capacitor $C_f$ may receive and store the voltage of the battery pack through the first relay 110.

The second relay 120 may be electrically connected to the opposite ends of the capacitor $C_f$. The second relay 120 may receive a second control signal $C_{trl2}$ from the MCU 150 and may perform a switching operation. If the second relay 120 receives the second control signal $C_{trl2}$ from the MCU 150, it becomes an active high state to then be turned on. Here, the second relay 120 may relay the voltage stored in the capacitor $C_f$ to the MCU 150 through the output buffer 130.

The second relay 120 may include an electromechanical relay or a semiconductor solid state relay (SSR) (e.g., a photo-MOS relay), but not limited thereto.

The electromechanical relay may include an inductor and an electromechanical switch. The electromechanical relay may be driven such that the electromechanical switch is magnetized by a current flowing in the inductor to perform a mechanical switching operation.

The photo-MOS relay may be an electronic switch that performs a switching operation in response to light.

The photo-MOS relay may include a light emitting diode (LED), a photo-sensor diode, and a metal oxide semiconductor field effect transistor (MOSFET). When a voltage is applied to the LED, light is generated, and the generated light is transferred to the photo-sensor diode. The photo-sensor diode exposed to the light turns on the photo-MOS relay as the voltage is applied between a source and a gate of the MOSFET.

The output buffer 130 may be electrically connected between an output port of the second relay 120 and an input port of the MCU 150. The output buffer 130 may include an operational amplifier (OP-AMP). A non-inverting terminal (+) of the OP-AMP 130 may be electrically connected to a first output $V_{po}$ of the second relay 120. An output port of the OP-AMP 130 may be electrically connected to form a negative feedback loop together with an inverting port (−) of the OP-AMP 130 for stabilizing of the output and may be electrically connected to the MCU 150.

The pull-down circuit block 140 may be electrically connected between output ports $V_{po}$, $V_{no}$ of the second relay 120. The pull-down circuit block 140 receives the second control signal $C_{trl2}$ from the MCU 150 and reduces impedance at the output ports $V_{po}$, $V_{no}$ of the second relay 120.

The pull-down circuit block 140 may include a pull-down resistor $R_{pd}$ and a switch T connected in series to each other between output ports $V_{po}$, $V_{no}$ of the second relay 120.

The pull-down resistor $R_{pd}$ reduces impedance at the output ports $V_{po}$, $V_{no}$ of the second relay 120 thereby preventing malfunction of the output buffer 130. A first terminal of the pull-down resistor $R_{pd}$ may be electrically connected to the first output port $V_{po}$ of the second relay 120. The pull-down resistor $R_{pd}$ may have a resistance value of about 0.5 MOhm to about 1.5 MOhm. The pull-down resistor $R_{pd}$ may have a resistance value of about 1 MOhm. The resistance value of about 0.5 MOhm to about 1.5 MOhm may provide an optimum balance between suppression of high impedance and transferability of high frequency signal. For example, if the pull-down resistor $R_{pd}$ is higher than or equal to about 0.5 MOhm and the second relay 120 operates in a high level, the amount of current input to the pull-down resistor $R_{pd}$ may sufficiently suppress impedance. As another example, if the resistance value of the pull-down resistor $R_{pd}$ is equal to lower than about 1.5 MOhm, high frequency signal may be sufficiently well transferred to the output buffer 130. However, depending on the embodiment, the pull-down resistor $R_{pd}$ may have a resistance value less than about 0.5 MOhm or greater than about 1 MOhm.

The switch T may be electrically connected between a second terminal of the pull-down resistor $R_{pd}$ and a second output port $V_{no}$ of the second relay 120. The switch T may be a transistor. The transistor T may include a first electrode, a second electrode and a control electrode. The first electrode of the transistor T may be electrically connected to the second terminal of the pull-down resistor $R_{pd}$. The second electrode of the transistor T may be electrically connected to the second output port $V_{no}$ of the second relay 120. The control electrode of the transistor T may receive the second control signal $C_{trl2}$ from the MCU 150.

The MCU 150 may apply the first control signal $C_{trl1}$ to the first relay 110 and the second control signal $C_{trl2}$ to the second relay 120 and the switch T to control the first relay 110, the second relay 120 and the pull-down circuit block 140 to be turned on/off, respectively.

Waveforms of the first control signal $C_{trl1}$ and the second control signal $C_{trl2}$ may be complementary with respect to each other. For example, if the value of the first control signal $C_{trl1}$ is in a high level, the value of the second control signal $C_{trl2}$ may be in a low level. In addition, if the value of the first control signal $C_{trl1}$ is in a low level, the value of the second control signal $C_{trl2}$ may be in a high level. Hereinafter, the operation, function and effect of the BMS 100 will be described.

First, the MCU 150 may output the first control signal $C_{trl1}$ having a high level value to the first relay 110. Here, the second control signal $C_{trl2}$ output from the MCU 150 may have a low level value, and the second relay 120 and the pull-down circuit block 140 may be turned off. Therefore, the first relay 110 receives the first control signal $C_{trl1}$ and becomes in an active high state to then be turned on. Here, the voltage of the opposite ends of the battery pack is divided by the distribution resistors $R_{d1}$ and $R_{d2}$ and then transferred to the capacitor $C_f$ via the first relay 110.

Next, the MCU 150 may output the second control signal $C_{trl2}$ having a high level value to the first relay 110. Here, the first control signal $C_{trl1}$ output from the MCU 150 may have a low level value, and the first relay 110 may be turned off. Therefore, the second relay 120 and the switch T may become in an active high state to then be turned on. Here, the second relay 120 may output the voltage stored in the capacitor $C_f$.

The BMS 100 may include an circuit element such as an inverter (not shown), connected to the MCU 150, which generates electro-magnetic wave that causes electrical or electromagnetic noise in the BMS 100, particularly, at the output of the second relay 120. For example, the output ports $V_{po}$, $V_{no}$ of the second relay 12 generally become high impedance state due to the electrical or electromagnetic noise. The high impedance at the output ports $V_{po}$, $V_{no}$ of the second relay 12 may subsequently cause malfunction of the OP-AMP 130, since the OP-AMP 130 may generate an output to the MCU 150 even when there is no output from the second relay 12.

In order to prevent the malfunction of the OP-AMP 130, the BMS 100 may include the pull-down resistor $R_{pd}$ installed between the output ports $V_{po}$, $V_{no}$ of the second relay 120. The pull-down resistor $R_{pd}$ reduces the impedance at the output ports $V_{po}$, $V_{no}$ of the second relay 120, thereby allowing the OP-AMP 130 to generate a normal output. However, in a case where only the pull-down resistor $R_{pd}$ is connected between the output ports $V_{po}$, $V_{no}$ of the second relay 120, a voltage drop may be generated at the output ports $V_{po}$, $V_{no}$ of the second relay 120. Therefore, the pull-down resistor $R_{pd}$ and the switch T connected in series to each other may be installed between the output ports $V_{po}$, $V_{no}$ of the second relay 120. The switch T and the second relay 120 may be operated by the second control signal $C_{trl2}$ output from the MCU 150. In one embodiment, the second control signal $C_{trl2}$ alternately turns on and turns off both the switch T and the second relay 120. In one embodiment, the second control signal $C_{trl2}$ has a very short period, for example, about 200 ms. In another embodiment, the period of the second control signal $C_{trl2}$ is in the range from about 150 ms to about 250 ms. In still another embodiment, the period of the second control signal $C_{trl2}$ is about 200 ms. Therefore, even if a voltage drop at the outputs $V_{po}$, $V_{no}$ of the second relay 120 occurs due to the pull-down resistor $R_{pd}$, since the period of the second control signal $C_{trl2}$ is very short, the final output of the second relay 120 can be substantially uniform.

Figure 2:
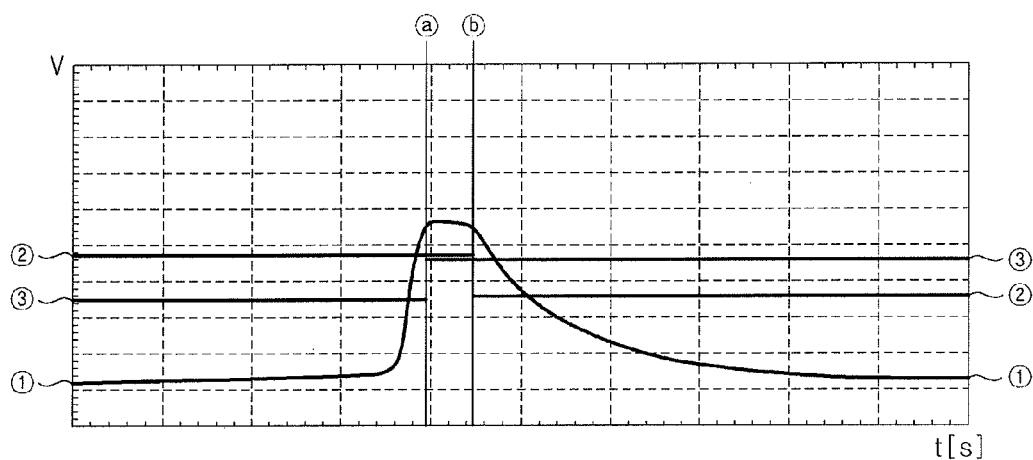
FIG. 2 is a graph illustrating output waveforms of a second relay in a case where only a pull-down resistor is installed between output ports of the second relay according to an embodiment.

FIG. 2 is a graph illustrating output waveforms of a second relay 120 in a case where only a pull-down resistor $R_{pd}$ is installed between the output ports $V_{po}$, $V_{no}$ of the second relay 120 according to an embodiment.

In FIG. 2, the horizontal axis indicates time t[s], and the vertical axis indicates output voltage V of the second relay 120. Specifically, the graph labeled ① indicates a signal output from the second relay 120 in a case where only the pull-down resistor $R_{pd}$ of 1 MOhm is installed between output ports of the second relay 120. The graph labeled ② indicates the first control signal $C_{trl1}$, and the graph labeled ③ indicates the second control signal $C_{trl2}$.

In the time period up until time ⓐ, the first control signal $C_{trl1}$ has a high level value and the second control signal $C_{trl2}$ has a low level value as shown in FIG. 2. Here, the first relay 110 is turned on to then relay the voltage V of the battery pack to the capacitor $C_f$ while the second relay 120 is turned off. In the time period after time ⓑ, the first control signal $C_{trl1}$ has a low level value and the second control signal $C_{trl2}$ has a high level value. Here, the first relay 110 is turned off and the second relay 120 is turned on to then output the voltage stored in the capacitor $C_f$. The output buffer 130 may transmit the voltage output from the second relay 120 to the MCU 150. In a section between ⓐ and ⓑ, value levels of the first control signal $C_{trl1}$ and the second control signal $C_{trl2}$ are changed. In one embodiment, the value levels of the first control signal $C_{trl1}$ and the second control signal $C_{trl2}$ are not immediately changed between high and low values. Rather, the first control signal $C_{trl1}$ and the second control signal $C_{trl2}$ temporarily have substantially the same value in the time period between ⓐ and ⓑ and the value levels thereof are then changed to low.

In the case where only the pull-down resistor $R_{pd}$ of 1 MOhm is installed between the output ports $V_{po}$, $V_{no}$ of the second relay 120, the impedance at the output ports $V_{po}$, $V_{no}$ of the second relay 120 can be reduced. However, a voltage drop may occur to the output ports $V_{po}$, $V_{no}$ of the second relay 120 by the pull-down resistor $R_{pd}$.

Figure 3:
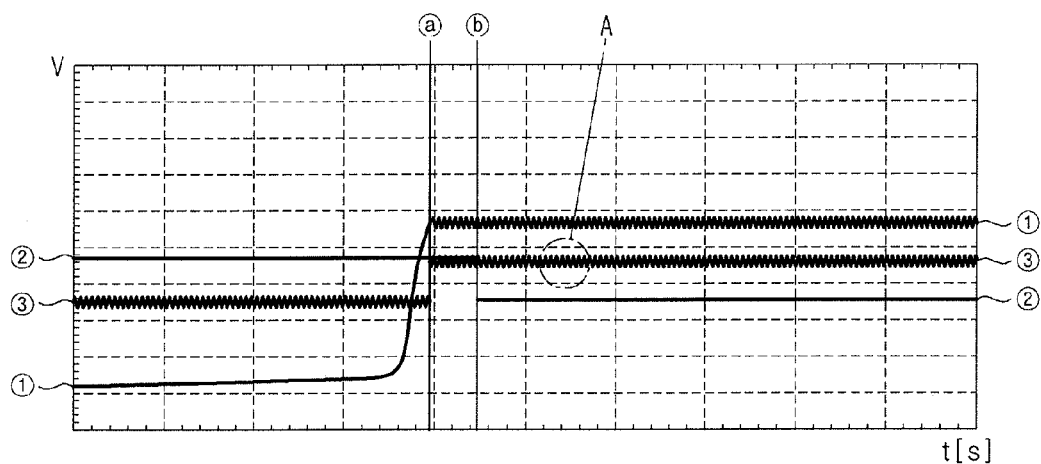
FIG. 3 is a graph illustrating output signals of a second relay in a case where a pull-down resistor and a switch are installed between output ports of the second relay according to an embodiment.
Figure 4:
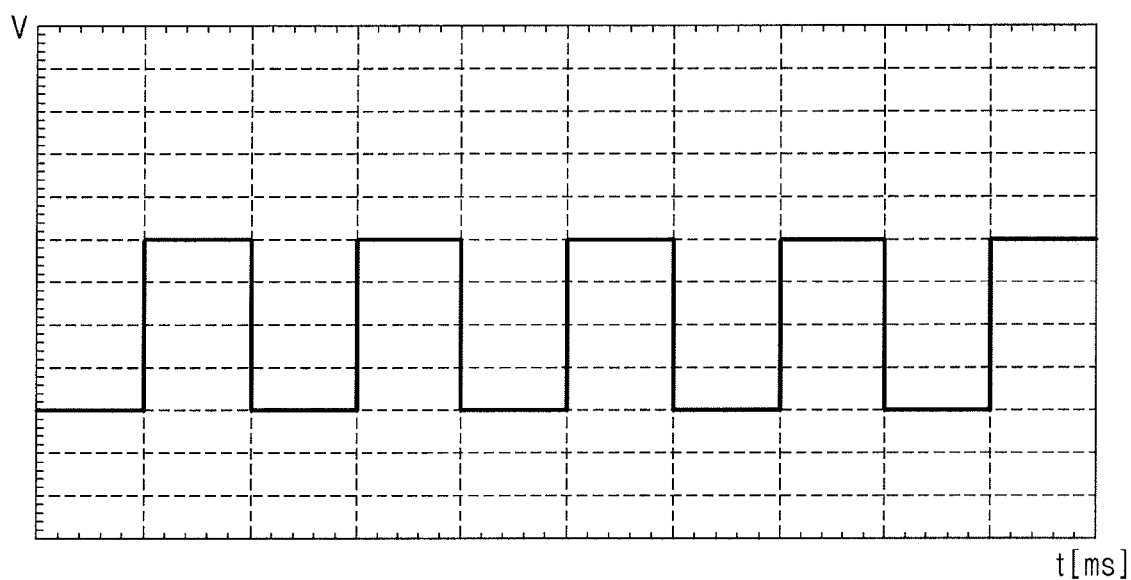
FIG. 4 is a graph illustrating an example enlarged view of a waveform of a second control signal shown in FIG. 3.

FIG. 3 is a graph illustrating output signals of a second relay 120 in a case where a pull-down resistor $R_{pd}$ and a switch T are installed between the output ports $V_{po}$, $V_{no}$ of the second relay 120 according to an embodiment. FIG. 4 is a graph illustrating an example enlarged view of a waveform of a second control signal shown in FIG. 3.

If the value of the first control signal $C_{trl1}$ is changed from a high level to a low level and the value of the second control signal $C_{trl2}$ is changed from a low level to a high level, the first relay 110 is turned off and the second relay 120 is turned on. In one embodiment, the MCU 150 repeatedly outputs signals of high and low level. In this embodiment, the second relay 120 and the switch T are alternately turned on and off based on the repeated control signals. Waveforms of the second control signal $C_{trl2}$ may be a square wave signal, as shown in FIG. 4, but not limited thereto. In one embodiment, the value of the second control signal $C_{trl2}$ is changed without substantially affecting the output of the second relay 120. In another embodiment, variation of the value of the second control signal $C_{trl2}$ controls the output signals of the second relay 120 to minutely oscillate, for example, as shown in FIG. 3 (see the graph labeled ③). In this embodiment, the negative feedback loop of the output buffer 130 makes the output signal of the second relay 120 more stable.

If the second relay 120 and the switch T are turned on, the pull-down resistor $R_{pd}$ is connected between the outputs $V_{po}$, $V_{no}$ of the second relay 120, the impedance at the output ports $V_{po}$, $V_{no}$ of the second relay 120 can be reduced. Furthermore, since the switch T is substantially periodically turned off, the output voltage of the second relay 120 is maintained at a substantially constant level, as shown in FIG. 3 (see the graph labeled ③), without a voltage drop.

According to at least one of the disclosed embodiments, a battery voltage can be measured in a more accurate and stable manner by suppressing high impedance at the output of a relay circuit (or a switch) while preventing a voltage drop.

While embodiments have been shown and described with reference to the accompanying drawings, it will be understood by those skilled in the art that various changes in form and details may be made therein without departing from the spirit and scope of the claims.

What is claimed is:

1. A battery management system (BMS), comprising:
    a first switching circuit electrically connected to a battery cell or a battery pack and configured to provide a voltage of the battery cell or the battery pack;
    a capacitor electrically connected to the first switching circuit and configured to store the voltage provided from the first switching circuit, wherein the capacitor includes first and second terminals;
    a second switching circuit electrically connected to the capacitor and configured to provide the voltage stored in the capacitor, wherein the second switching circuit includes first and second input terminals, and first and second output terminals, and wherein the first and second terminals of the capacitor are respectively directly connected to the first and second input terminals of the second switching circuit; and
    a pull-down circuit electrically connected to the second switching circuit, and configured to reduce impedance at the first output terminal of the second switching circuit, wherein the pull-down circuit comprises a pull-down resistor and a transistor connected to each other.

2. The battery management system of claim 1, further comprising a controller configured to control on and off operations of the first and second switching circuits, and configured to receive the voltage that has been stored in the capacitor.

3. The battery management system of claim 2, wherein a first end of the pull-down resister is electrically connected to the first output terminal of the second switching circuit.

4. The battery management system of claim 3, wherein the pull-down resistor has a resistance value in the range from 0.5 megaohm (MOhm) to 1.5 MOhm.

5. The battery management system of claim 4, wherein the pull-down resistor has a resistance value of 1 MOhm.

6. The battery management system of claim 3, wherein the transistor is connected to a second end of the pull-down resistor.

7. The battery management system of claim 6, wherein the transistor has i) a first electrode electrically connected to the second end of the pull-down resistor, ii) a second electrode electrically connected to the second output terminal of the second switching circuit and iii) a control electrode electrically connected to the controller.

8. The battery management system of claim 7, wherein the controller is configured to provide i) a first control signal to the first switching circuit and ii) a second control signal to the second switching circuit and the control electrode of the transistor.

9. The battery management system of claim 8, wherein the second control signal is configured to periodically turn on and turn off the transistor.

10. The battery management system of claim 8, wherein the controller is configured to change the value of the second control signal without affecting the voltage at the first output terminal of the second switching circuit.

11. The battery management system of claim 8, wherein the second control signal comprises a plurality of square waves that are periodically repeated.

12. The battery management system of claim 1, wherein each of the switching circuits comprises a relay.

13. The battery management system of claim 1, further comprising an output buffer.

14. The battery management system of claim 13, wherein the output buffer comprises an operational amplifier.

15. A battery management system (BMS), comprising:
    a first relay electrically connected to a battery and configured to relay a voltage of the battery;
    a capacitor electrically connected to the first relay and configured to store the voltage relayed from the first relay, wherein the capacitor includes first and second terminals;
    a second relay electrically connected to the capacitor and configured to relay the voltage stored in the capacitor, wherein the second relay circuit includes first and second input terminals, and wherein the first and second terminals of the capacitor are respectively directly connected to the first and second input terminals of the second relay circuit;
    a resistor having first and second ends, wherein the first end is electrically connected to an output terminal of the second relay; and
    a switching transistor electrically connected to the resistor and configured to be alternately turned on and turned off based on a control signal applied thereto.

16. The battery management system of claim 15, wherein the control signal is a square wave signal comprising a plurality of square waves that are periodically repeated.

17. A battery system, comprising:
    a battery;

a capacitor receiving a voltage from the battery, wherein the capacitor includes first and second terminals;

a voltage relay circuit electrically connected to the capacitor and configured to relay the voltage stored in the capacitor, wherein the voltage relay circuit comprises first and second input terminals, and an output terminal, and wherein the first and second terminals of the capacitor are respectively directly connected to the first and second input terminals of the voltage relay circuit;

a resistor having first and second ends, wherein the first end is electrically connected to the output terminal of the voltage relay circuit;

a switch electrically connected to the second end of the resistor; and a controller configured to control the switch, wherein the switch is configured to prevent a voltage drop at the output terminal of the voltage relay circuit based on a control signal received from the controller.

\* \* \* \* \*